(12) United States Patent
Tseng et al.

(10) Patent No.: US 7,991,605 B1
(45) Date of Patent: Aug. 2, 2011

(54) METHOD AND APPARATUS FOR TRANSLATING A VERIFICATION PROCESS HAVING RECURSION FOR IMPLEMENTATION IN A LOGIC EMULATOR

(75) Inventors: Ping-sheng Tseng, Saratoga, CA (US); Song Peng, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 540 days.

(21) Appl. No.: 12/134,727

(22) Filed: Jun. 6, 2008

(51) Int. Cl.
*G06F 17/50* (2006.01)
*G06F 9/455* (2006.01)

(52) U.S. Cl. .......... 703/15; 716/106; 716/107; 716/111

(58) Field of Classification Search .............. 703/15; 716/106, 107, 111
See application file for complete search history.

(56) References Cited

U.S. PATENT DOCUMENTS

| | | | |
|---|---|---|---|
| 5,963,739 A * | 10/1999 | Homeier | 717/126 |
| 6,907,599 B1 * | 6/2005 | Kashai et al. | 717/137 |
| 7,448,008 B2 * | 11/2008 | Seigler et al. | 716/106 |
| 7,672,965 B2 * | 3/2010 | Bax | 716/111 |
| 7,757,191 B2 * | 7/2010 | Chan | 716/108 |
| 7,779,377 B2 * | 8/2010 | Nakata | 716/105 |

* cited by examiner

*Primary Examiner* — Dwin M Craig

(74) *Attorney, Agent, or Firm* — Holland & Knight LLP; Brian J. Colandreo, Esq.; Mark H. Whittenberger, Esq.

(57) ABSTRACT

Method and apparatus for translating a verification process having recursion for implementation in a logic emulator are described. Examples of the invention relate to a method, apparatus, and computer readable medium for translating a verification process for implementation in a hardware emulator of a logic verification system. A recursive task called by the verification process is identified. A copy of the recursive task is incorporated into the verification process. Interface registers are instantiated for the recursive task. Control flow transfer points are defined in the verification process. Calls of the recursive task are converted in the verification process to constructs for accessing the interface registers and transferring control flow among the control flow transfer points. The verification process is reorganized to describe a finite state machine (FSM) configured for implementation in the hardware emulator.

20 Claims, 10 Drawing Sheets

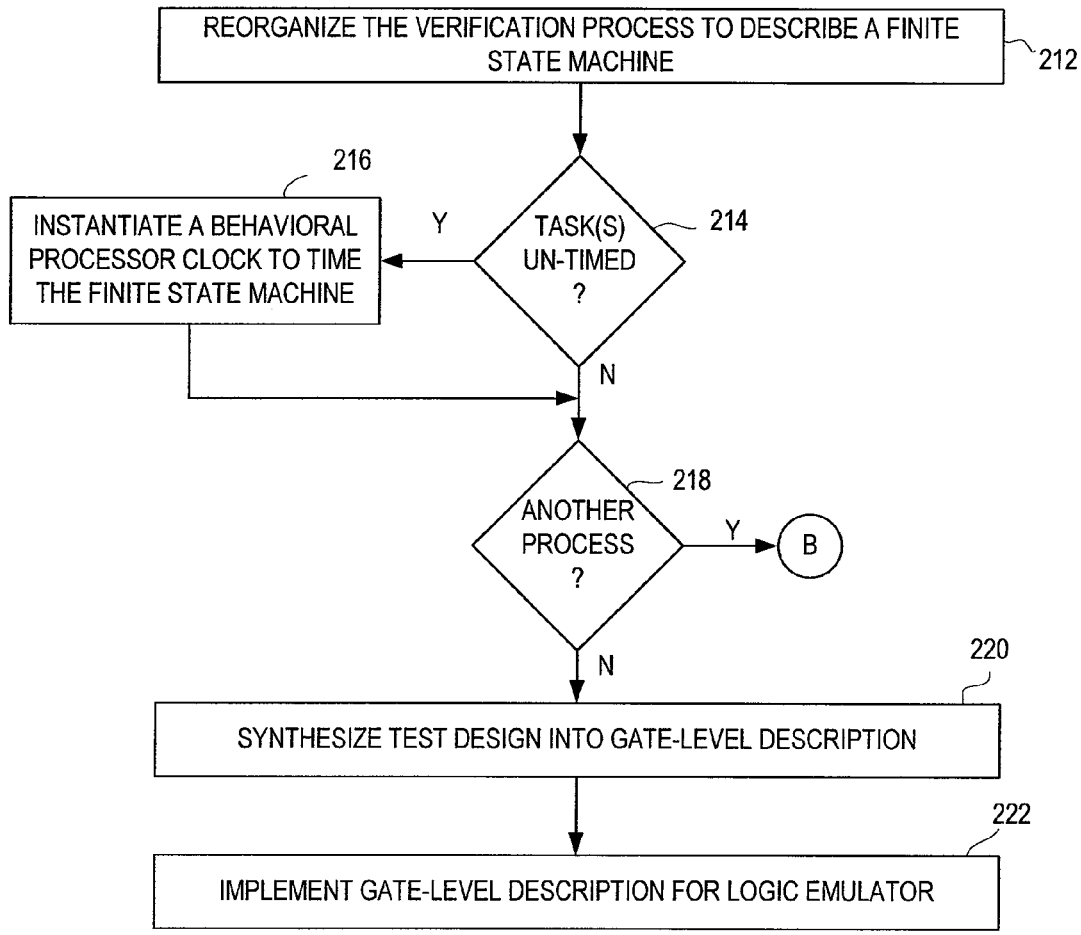
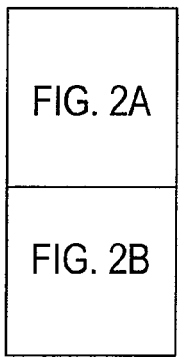
FIG. 2B

302
```
task automatic search(inout int tree, input int v);
int data;
if (tree != 0) begin
data = NodeData[tree];
if (v < data) begin
tree = LeftChild[tree];
search(tree, v);
end if(v > data) begin
tree = RightChild[tree];
search(tree, v);
end
end
Endtask
```

304
```
task automatic compute(input int tree, output int sum);
int lsum, rsum;
if(tree == 0) begin
sum = 0;
else begin
compute(LeftChild[tree], lsum);
compute(RightChild[tree], rsum);
sum = NodeData[tree]+lsum+rsum;
end
endtask;
```

306
```
always@(posedge clk) begin: processX
xtree = xTreeTop;
search(xtree, xvalue);
compute(xtree, xsum);
End
```

308
```
always@(negedge clk) begin: processY
ytree = yTreeTop
search(ytree, yvalue);
compute(ytree, ysum);
ytree = yTreeTop;
search(ytree, ysum);
compute(ytree, ysum2);
end
```

300   FIG. 3

```
always@(posedge clk) begin: processX
xtree = xTreeTop;
search(xtree, xvalue);
compute(xtree, xsum);

task automatic Xsearch(inout int tree, input int v);
int data;
if (tree != 0) begin
data = NodeData[tree];
if (v < data) begin
tree = LeftChild[tree];
Xsearch(tree, v);
end if(v > data) begin
tree = RightChild[tree];
Xsearch(tree, v);
end
end
Endtask task automatic Xcompute(input int tree, output int
sum);
int lsum, rsum;
if(tree == 0) begin
sum = 0;
else begin
Xcompute(LeftChild[tree], lsum);
Xcompute(RightChild[tree], rsum);
sum = NodeData[tree]+lsum+rsum;
end
endtask;

end // processX
```

FIG. 4

```
always@(negedge clk) begin: processY
ytree = yTreeTop
search(ytree, yvalue);
compute(ytree, ysum);
ytree = yTreeTop;
search(ytree, ysum);
compute(ytree, ysum2);

task automatic Ysearch(inout int tree, input int v);
int data;
if (tree != 0) begin
data = NodeData[tree];
if (v < data) begin
tree = LeftChild[tree];
Ysearch(tree, v);
end if(v > data) begin
tree = RightChild[tree];
Ysearch(tree, v);
end
end
Endtask task automatic Ycompute(input int tree, output int sum);
int lsum, rsum;
if(tree == 0) begin
sum = 0;
else begin
Ycompute(LeftChild[tree], lsum);
Ycompute(RightChild[tree], rsum);
sum = NodeData[tree]+lsum+rsum;
end
endtask;

end // process Y
```

FIG. 5

```
always@(posedge clk) begin: processX
goto L_processX;
L_Xsearch:
if (Xs_tree != 0) begin
data = NodeData[Xs_tree];
if (Xs_v < data) begin
Xs_tree = LeftChild[Xs_tree];

{Xs_tree, Xs_v, Xs_rtn} = {Xs_tree, Xs_v, L3};
goto L_Xsearch;

end if(Xs_v > data) begin
Xs_tree = RightChild[Xs_tree];

{Xs_tree, Xs_v, Xs_rtn} = {Xs_tree, Xs_v, L3};
goto L_Xsearch;

end
end
L3: goto Xs_rtn;

L_Xcompute:
if(Xc_tree == 0) begin
Xc_sum = 0;
end else begin

{Xc_tree, Xc_rtn}={LeftChild[Xc_tree], L4};
goto L_Xcompute;
L4: lsum = Xc_sum;

{Xc_tree, Xc_rtn}={RightChild[Xc_tree], L5};
goto L_Xcompute;
L5: rsum = Xc_sum;

Xc_sum = NodeData[Xc_tree]+lsum+rsum;
end
goto Xc_rtn;

L_processX:
xtree = xTreeTop;

{Xs_tree, Xs_v, Xs_rtn} = {xtree, xvalue, L1};
goto L_Xsearch;
L1: xtree = Xs_tree;

{Xc_tree, Xc_rtn} = {xtree, L2};
Goto L_Xcompute;
L2: xsum = Xc_sum;

end
```

FIG. 7

```
always@(posedge clk) begin: processX
goto L_processX;
L_Xsearch:
if (Xs_tree != 0) begin
data = NodeData[Xs_tree];
if (Xsearch_v < data) begin
Xs_tree = LeftChild[Xs_tree];

goto L_Xsearch;

end if(Xs_v > data) begin
Xs_tree = RightChild[Xs_tree];

goto L_Xsearch;

end
end else begin
goto Xs_rtn;
End

L_Xcompute:
if(Xc_tree == 0) begin
Xc_sum = 0;
end else begin

Xc_Context[stack++] = {Xc_tree, Xc_rtn, lsum, rsum};
{Xc_tree, Xc_rtn} = {LeftChild[Xc_tree], L4};
goto L_Xcompute;
L4: {Xc_tree, Xc_rtn, lsum, rsum} = Xc_Context[stack--];
lsum = Xc_sum;

Xc_Context[stack++] = {Xc_tree, Xc_rtn, lsum, rsum};
{Xc_tree, Xc_rtn} = {RightChild[Xc_tree], L5};
goto L_Xcompute;
L5: {Xc_tree, Xc_rtn, lsum, rsum} = Xc_Context[stack--];
rsum = Xc_sum;

Xc_sum = NodeData[Xc_tree]+lsum+rsum;
end
goto Xc_rtn;

L_processX:
xtree = xTreeTop;
{Xs_tree, Xs_v, Xs_rtn} = {xtree, xvalue, L1};
goto L_Xsearch;
L1: xtree = Xs_tree;
{Xc_tree, Xc_rtn} = {xtree, L2};
goto L_Xcompute;
L2: xsum = Xc_sum;
end
```

FIG. 8

```
always@(posedge clk) begin: processX
State = L_processX; done = 0;
while(!done) begin
case (State) begin
L_Xsearch: begin
if (Xs_tree != 0) begin
data = NodeData[Xs_tree];
if (Xs_v < data) begin
Xs_tree = LeftChild[Xs_tree];
State = L_Xsearch;
end if(Xs_v > data) begin
Xs_tree = RightChild[Xs_tree];
State = L_Xsearch;
end
end else begin
State = Xs_rtn;
end
end
L_Xcompute: begin
if(Xc_tree == 0) begin
Xc_sum = 0;
State = Xcompute_rtn;
end else begin
Xc_Contex[stack++] = {Xc_tree, Xc_rtn, lsum, rsum};
{Xc_tree, Xc_rtn} = {LeftChild[Xc_tree], L4};
State = L_Xcompute;
end
end
L4: begin
{Xc_tree, Xc_rtn, lsum, rsum} = Xc_Context[stack--];
lsum = Xc_sum;
Xc_Context[stack++] = {Xc_tree, Xc_rtn, lsum, rsum};
{Xc_tree, Xc_rtn} = {RightChild[Xc_tree], L5};
State = L_Xcompute;
end
L5: begin
{Xc_tree, Xc_rtn, lsum, rsum} = Xc_Context[stack--];
rsum = Xc_sum;
Xc_sum = NodeData[Xc_tree]+lsum+rsum;
State = Xcompute_rtn;
end
L_processX: begin
xtree = xtreeTop; {Xs_tree, Xs_v, Xs_rtn} = {xtree, xvalue; L1};
State = L_Xsearch;
end
L1: begin
xtree = Xs_tree; {Xc_tree, Xc_rtn} = {xtree, L2};
State = L_Xcompute;
end
L2: begin
xsum = Xc_sum;
done = 1;
end
Endcase
end //while
end //processX
```

METHOD AND APPARATUS FOR TRANSLATING A VERIFICATION PROCESS HAVING RECURSION FOR IMPLEMENTATION IN A LOGIC EMULATOR

BACKGROUND OF THE INVENTION

1. Field of the Invention

Embodiments of the invention generally relate to electronic design automation and, more specifically, to a method and apparatus for translating a verification process having recursion for implementation in a logic emulator.

2. Description of the Related Art

In electronic design automation (EDA), functional verification is the task of verifying that a logic design conforms to its specification before the logic design is manufactured as integrated circuits (ICs). Logic designs may be described using various languages, such as hardware description languages (HDLs) or other more abstract languages (e.g., synthesizable SystemC). Functional verification can be performed using a hardware emulation system, where the logic design is mapped into an emulator to provide a design under verification (DUV). As used herein, an "emulator" refers to any type of hardware in which the design runs, such as emulator, hardware accelerator, or the like. Such emulation systems allow a design to run much faster than pure software simulation on a general-purpose computer or workstation.

In logic verification, engineers create a test design to functionally verify the logic design by providing verification processes to check that, given certain input stimuli, the design performs to specification. A test design may be written using various languages, including lower-level languages, such as very high speed integrated circuit HDL (VHDL), Verilog, and the like, as well as more abstract languages, such as C/C++, SystemC, SystemVerilog, and the like. Notably, some verification processes can be defined efficiently using recursive tasks (e.g., a task that repeatedly calls itself until some condition is satisfied). In some cases, there is no direct method to define a verification process without using one or more recursive tasks.

Hardware emulators typically include programmable logic devices or other types of integrated circuits (ICs) in which the DUV is implemented. As such, all design and verification processes must be transformed into gate-level logic before such processes can run on the hardware. For example, such processes can be synthesized and a physical hardware implementation formed for a target emulator. However, in most hardware description languages, recursive tasks are not synthesizable and cannot be directly mapped to gate-level logic of a hardware implementation for emulation. As such, verification processes that utilize recursive tasks must be implemented in software and executed on a general-purpose computer system or workstation. Such software verification processes must use co-simulation interfaces to work with the emulator. Software simulation is inherently slower than the hardware simulation, and thus the recursive tasks run slower and less efficiently as compared to the design under verification. As a result, the logic verification process is slower and less efficient as compared to pure hardware systems.

Accordingly, there exists a need in the art for a method and apparatus for translating recursive logic verification processes of a logic design into synthesizable constructs for mapping onto gate-level logic.

SUMMARY OF THE INVENTION

Aspects of the invention relate to a method, apparatus, and computer readable medium for translating a verification process for implementation in a hardware emulator of a logic verification system. A recursive task called by the verification process is identified. A copy of the recursive task is incorporated into the verification process. Interface registers are instantiated for the recursive task. Control flow transfer points are defined in the verification process. Calls of the recursive task are converted in the verification process to constructs for accessing the interface registers and transferring control flow among the control flow transfer points. The verification process is reorganized to describe a finite state machine (FSM) configured for implementation in the hardware emulator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A and 2B show a block diagram depicting an exemplary embodiment of a method for translating a verification process for implementation in a hardware emulator in accordance with one or more aspects of the invention;

FIG. 3 illustrates an exemplary non-limiting embodiment of a portion of a test design in accordance with one or more aspects of the invention;

FIGS. 4 and 5 illustrate processes having privatized copies of tasks in accordance with one or more aspects of the invention;

FIGS. 7 and 8 illustrate a verification process after stages of task call conversion of FIG. 6 in accordance with one or more aspects of the invention; and FIG. 9 illustrates a verification process after reorganization to describe an finite state machine (FSM) in accordance with one or more aspects of the invention.

DETAILED DESCRIPTION

Figure 1:
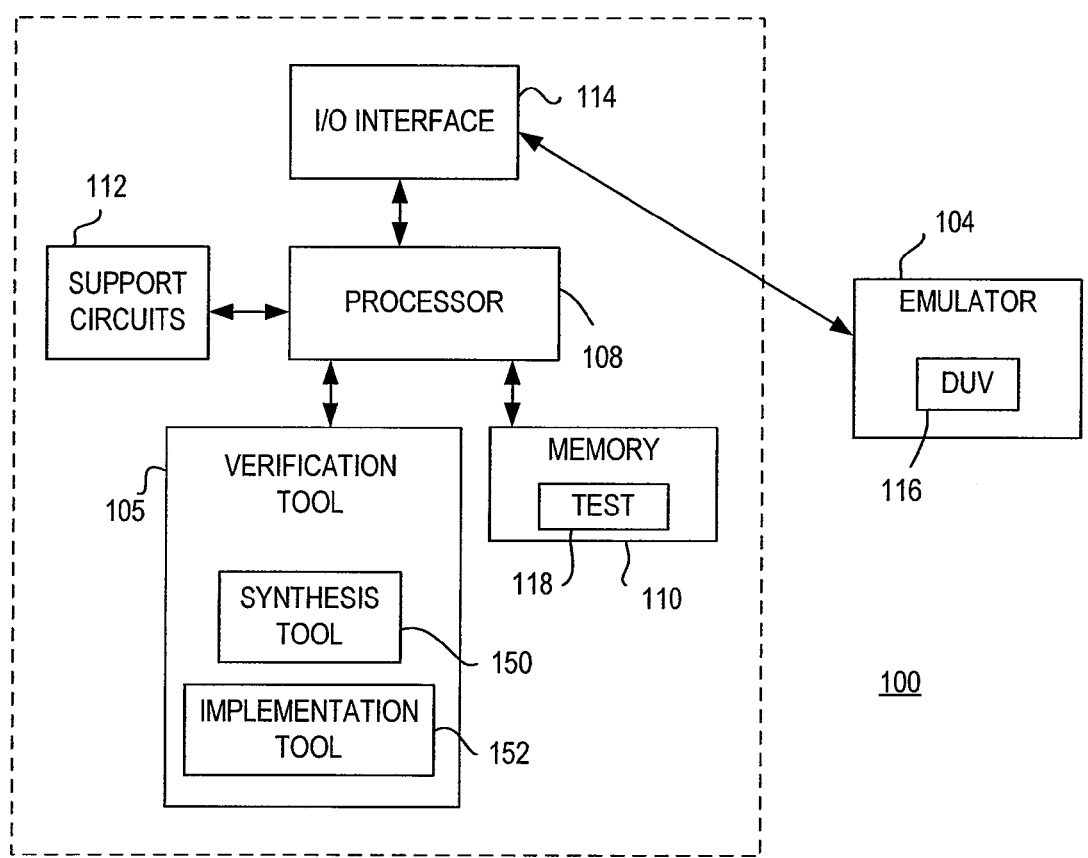
FIG. 1 is a block diagram depicting an exemplary embodiment of a logic design verification system in accordance with one or more aspects of the invention.

FIG. 1 is a block diagram depicting an exemplary embodiment of a logic design verification system 100 in accordance with one or more aspects of the invention. The system 100 includes a computer 102 coupled to an emulator 104 via a communication link 106. The computer 102 may comprise any type of general-purpose or specific-purpose computer. For example, the computer 102 may include a processor 108, a memory 110, various support circuits 112, and an I/O interface 114. The processor 108 may include one or more microprocessors known in the art. The support circuits 112 for the processor 108 include conventional cache, power supplies, clock circuits, data registers, I/O interfaces, and the like. The I/O interface 114 may be directly coupled to the memory 110 or coupled through the processor 108. The I/O interface 114 may also be configured for communication with the emulator 104. The memory 110 may include one or more of the following random access memory, read only memory, magnetoresistive read/write memory, optical read/write memory, cache memory, magnetic read/write memory, and the like, as well as computer readable media, as described below.

The emulator 104 may comprise any type of acceleration or acceleration/emulation platform. For example, the emulator 104 may include one or more programmable logic devices (PLDs), such as field programmable gate arrays (FPGAs). The communication link 106 comprises any type of high-speed bus for the transfer of signals between the computer 102 and the emulator 104.

The computer 102 may be loaded with a verification tool 105. The verification tool 105 may include a synthesis tool 150 and an implementation tool 152. The synthesis tool 150 is configured to translate a hardware description of a logic design into gate-level description, such as a register transfer level (RTL) or other type of gate-level netlist. The hardware description may be specified using a synthesizable language, including hardware description languages (HDLs), such as VHDL or Verilog, or higher-level languages, such as synthesizable SystemC, System Verilog, and the like. The implementation tool 152 is configured to translate the gate-level description produced by the synthesis tool 150 into a physical description that can be loaded in the emulator 104 to provide a hardware implementation of the logic design. For example, the physical description may comprise a bitstream that can be loaded to configure a PLD with a design. The term "tool" as used herein is meant to encompass software implementations, hardware implementations, or a combination of hardware and software implementations. For example, the verification tool 105 can be implemented using software stored in the memory 110 and executed by the processor 108, using PLDs or application specific integrated circuits (ASICs), or a combination thereof.

The emulator 104 is configured with a design under verification (DUV) 116. The DUV 116 can be specified using any synthesizable language and can be compiled into a form suitable for execution by the emulator 104 by the verification tool 105. For example, the DUV 116 may be implemented using reconfigurable hardware of the emulator 104, such as configuration in one or more PLDs. The verification tool 105 may be used to configure the emulator 104 with the DUV 116.

In addition, the verification tool 105 may be used to establish a test design 118 (sometimes referred to as a test bench). The test design 118 is configured to execute one or more verification processes on the DUV 116 for functionally verifying the logic design of the DUV 116. Notably, the test design 118 may be written using any synthesizable language. The verification tool 105 can synthesize and implement the test design 118 in a form suitable for execution by the emulator 104 using the synthesis tool 150 and the implementation tool 152. The test design 118 may include one or more verification processes that utilize one or more recursive tasks. The term "recursive task" as used herein is meant to encompass any type of procedural block of statements, such as a function, procedure, subroutine, module, task, or the like, the implementation of which references itself. Exemplary recursive tasks are described below. As described below, the synthesis tool 150 is configured to translate recursive tasks into synthesizable descriptions such that verification process(es) of the test design 118 can be implemented in the emulator 104 along with the DUV 116.

Figure 2A:
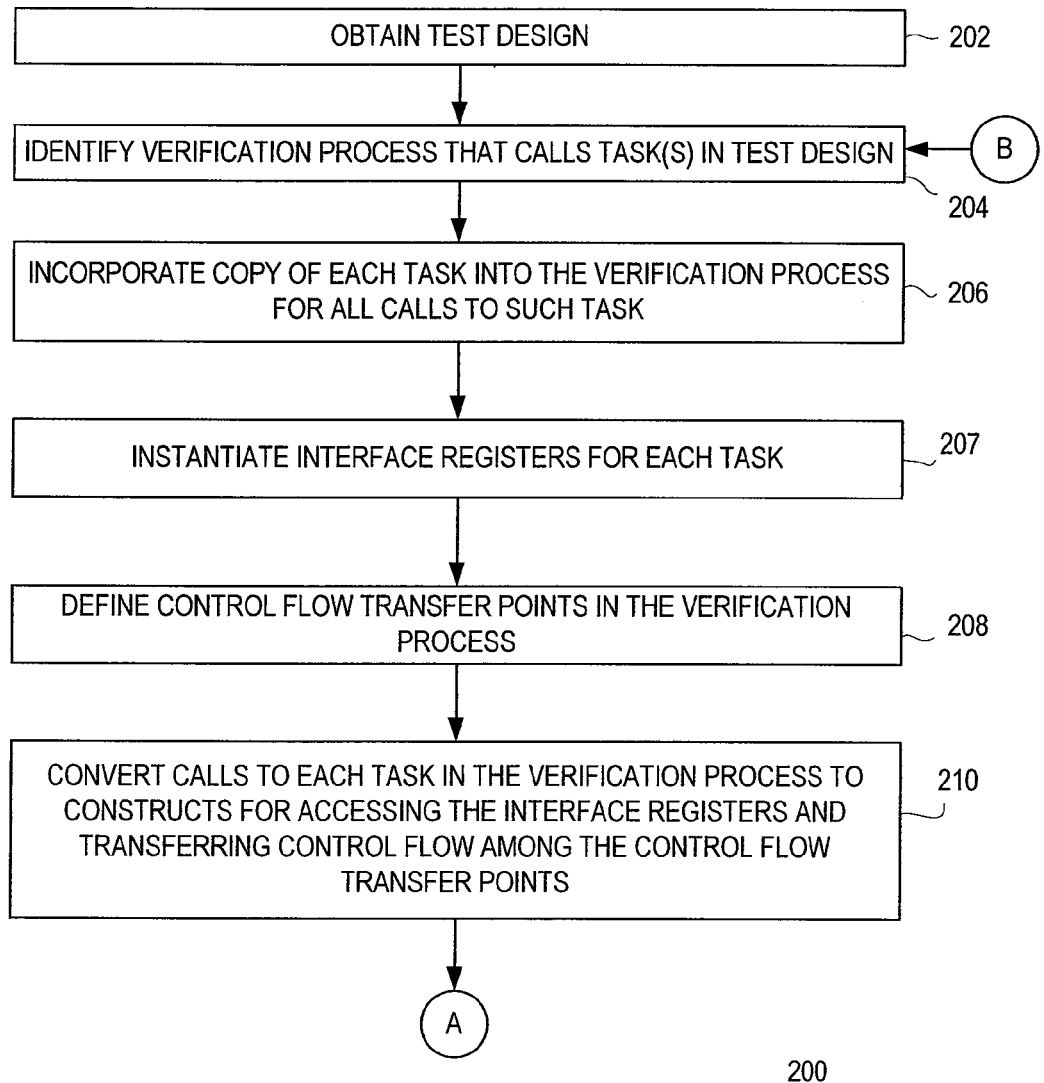

FIGS. 2A and 2B show a block diagram depicting an exemplary embodiment of a method 200 for translating a verification process for implementation in a hardware emulator in accordance with one or more aspects of the invention. The method 200 may be performed by the synthesis tool 150 to translate one or more verification processes that utilize recursive tasks into synthesizable descriptions capable of hardware implementation. Notably, the verification process may be written using any of the synthesizable languages noted above. In general, the test design 118 may include a hierarchy of modules. A module may define various components and signals, various procedural blocks that execute concurrently ("concurrent processes" or "verification processes"), and various tasks. In general, a task is a function, subroutine, or the like that has any number of input, output, or input/output arguments. Tasks that reference themselves are referred to as recursive tasks. One or more of the verification processes in the test design 118 may utilize at least one recursive task. A verification process can utilize a recursive task directly by calling the recursive task, or indirectly, for example, by calling a task that calls a recursive task.

Aspects of the method 200 may be understood with reference to the following example. The following example refers to code portions written in Verilog or SystemVerilog. Those skilled in the art will appreciate other languages include constructs similar to Verilog and that the invention can be utilized with hardware descriptions written in languages other than Verilog.

FIG. 3 illustrates an exemplary non-limiting embodiment of a portion 300 of the test design 118 in accordance with one or more aspects of the invention. The portion 300 includes a task "search" (302), a task "compute" (304), a process "X" (306), and a process "Y" (308). The search task 302 defines a recursive task that locates a node in a binary tree ("tree") that matches a given value ("v"). The compute task 304 defines a recursive task that computes a sum ("sum") of all the nodes of a binary tree ("tree"). The X process 306 is a verification process that searches for a node by calling the search task 302, and then computes the sum of the sub-tree from the located node by calling the compute task 304. The Y process 308 is a verification process that performs the search and compute tasks 302 and 304 twice.

Returning to FIGS. 2A and 2B, the method 200 begins at block 202, where a verification test design is obtained. At block 204, a verification process that calls at least one task is identified in the test design. At least one of the called task(s) may be a recursive task. For example, the process may have one or more calls to each recursive task (either directly or indirectly). At block 206, a copy of each task is incorporated into the verification process for all calls to such task. This process may be referred to as "task privatization". Notably, task privatization is different than task in-lining. In task in-lining, a copy of the task is inserted in the process each time the task is called (i.e., a complete copy of the task is inserted for each call to the task). In task privatization, only a single copy of the task is included in the verification process for all calls to that task.

FIG. 4 illustrates the X process 306 having privatized copies of the search task 302 and the compute task 304. In the present example, each of the search task 302 and the compute task 304 are recursive tasks. FIG. 5 illustrates the Y process 308 having privatized implementations of the search task 302 and the compute task 304. Note that only one copy for each of the search task 302 and the compute task 304 is included in the Y process 308, even though the Y process 308 calls the search task 302 and the compute task 304 twice.

Returning to FIGS. 2A and 2B, at block 207, interface registers for each task are instantiated. At block 208, control flow transfer points are defined in the verification process. At block 210, calls of each task in the verification process are converted to constructs for accessing the interface registers and transferring control flow among the control flow transfer points. At block 212, each verification process is reorganized to describe a finite state machine (FSM).

In the verification process, a control flow transfer point may be implemented using a label. The control flow transfer points may include an entry point for each task, and entry point for the verification process, and one or more continuation points. Control flow can be transferred among the control flow transfer statements using a branch statement, such as a "goto" or like type statement. For each task, the interface registers may include one or more argument registers and a continuation register. The argument register(s) can be used to pass the value(s) of the task arguments. The continuation register can be used to pass values (indicative of the control flow transfer points, such as the continuation point(s), when control flow is transferred.

For each of the calls to a given task, the constructs for transferring control flow may include a jump in the control flow to the entry point of the task, followed by a return of the control flow to a continuation point. For one or more of the calls to a given task, the constructs for accessing the interface registers include setting values to the interface registers (e.g., argument(s) and continuation point). For one or more of the calls to a given task, the constructs for accessing the interface registers include retrieving values from the interface registers (e.g., arguments and continuation point). An exemplary embodiment of a process for task call conversion is described below.

Once the calls to each of the tasks are converted (block 210), the FSM is created (block 212). The FSM may be created by mapping the entry point of each task, the entry point of the verification process, and the continuation point(s) to states of the FSM, where the states include a single entry point and single exit point. The control flow transfers among the control flow transfer points (now states) become state transitions.

Continuing with the method 200, at block 214, a determination is made whether any of the tasks is/are un-timed. If any of the tasks is/are un-timed, then the FSM generated at block 212 is also un-timed. By "un-timed", it is meant that a given task does not process its sequence of computation steps responsive to a clock signal. If the FSM is un-timed, the FSM cannot be directly synthesized into gate-level logic. Alternatively, if each of the tasks uses a clock signal, then the FSM can be directly synthesized into gate-level logic. Thus, if at block 214 any of the tasks is/are un-timed, the method 200 proceeds to block 216. Otherwise, the method proceeds to block 218. At block 216, a behavioral processor clock can be instantiated to time the FSM. The method 200 then proceeds to block 218.

At block 218, a determination is made whether the test design 118 includes additional verification processes. If so, the method 200 returns to block 204 and repeats. Otherwise, the method 200 proceeds to block 220. Although the method 200 is described as sequentially processing the verification processes, those skilled in the art will appreciate that all or a portion of the blocks in the method 200 described above can be performed on a plurality of verification processes concurrently.

At block 220, the test design, including the verification process or processes each translated to define the FSM, can be synthesized to generate a gate-level description. At step 222, the gate-level description can be implemented for the emulator.

Figure 6:
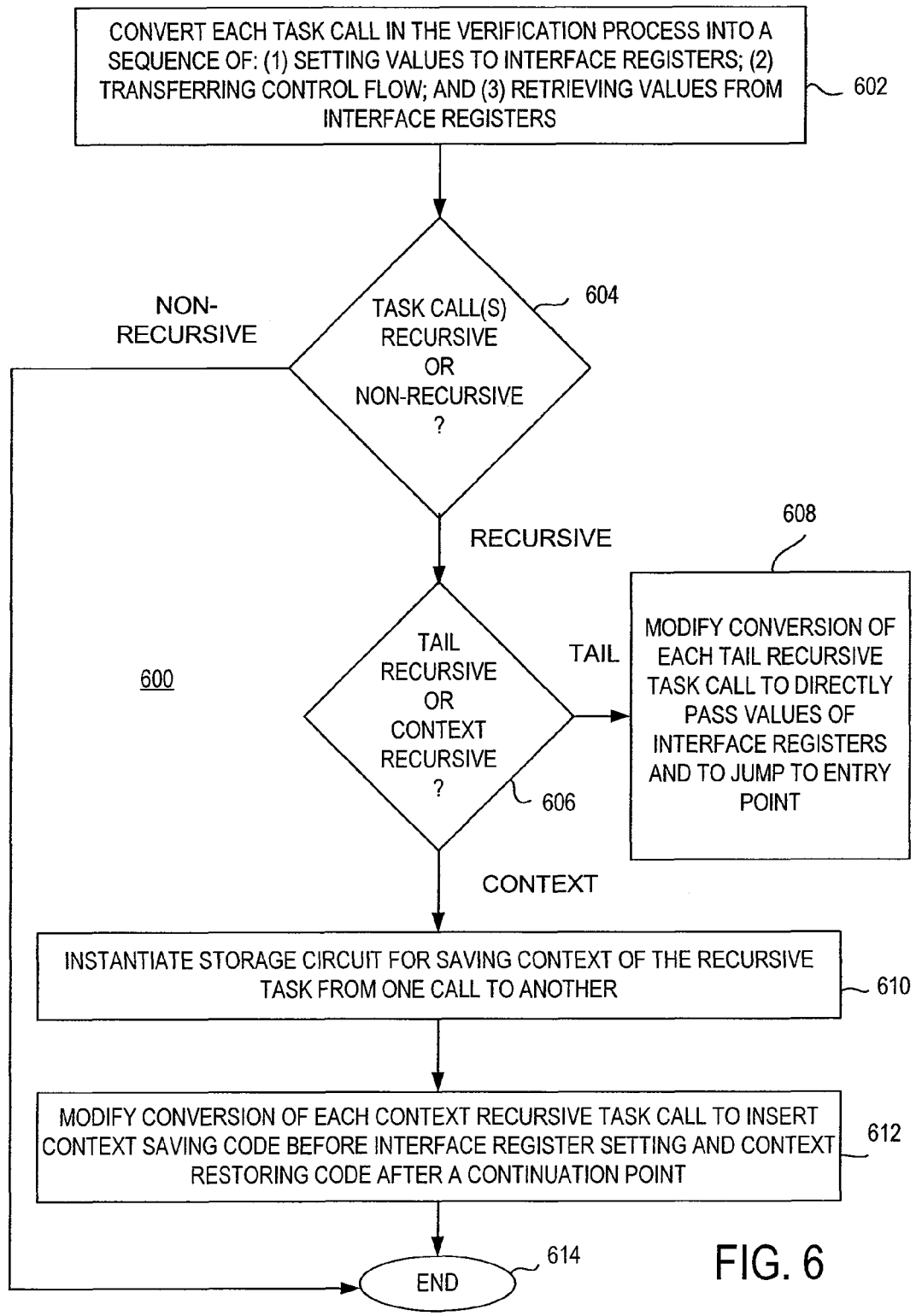
FIG. 6 is a flow diagram depicting an exemplary embodiment of a method of task call conversion in a verification process in accordance with one or more aspects of the invention.

FIG. 6 is a flow diagram depicting an exemplary embodiment of a method 600 of task call conversion in a verification process in accordance with one or more aspects of the invention. The method 600 may be performed by the block 210 in the method 200 of FIGS. 2A and 2B described above. The method 600 begins at block 602, where each task call in the verification process is converted into a sequence of: (1) setting values to interface registers for the task; (2) transferring control flow; and (3) retrieving values from the interface registers for the task. The verification process may also be optimized as part of block 602 to account for the converted task calls, as described in the example below.

FIG. 7 illustrates the X process 306 after task calls therein have been converted as in block 602. Entry points "L_Xsearch" and "L_Xcompute" have been defined for the search task 302 and the compute task 304. An entry point "L_processX" has been defined for an original portion 305 of the X process 306. Continuation points "L1", "L2", "L3", "L4", and "L5" have also been defined. Interface registers "Xs_tree", "Xs_v", and "Xs_rtn" have been instantiated for the search task 302, where Xs_tree and Xs_v are argument registers, and Xs_rtn is a continuation register. Interface registers "Xc_tree", "Xc_sum", and "Xc_rtn" have been instantiated for the compute task 304, where Xc_tree and Xc_sum are argument registers and Xc_rtn is a continuation register.

A box 702 shows a converted call to the search task 302 from the X process 306. The original call of "search (xtree, xvalue)" is converted into an interface register setting for Xs_tree, Xs_v, and Xs_rtn, a jump in the control flow to the entry point L_Xsearch, and an interface register retrieval from Xs_tree. A return of the control flow to continuation point L1 is established by setting the continuation register Xs_rtn to a value indicative of L1.

A box 706 shows a converted call to the search task 302 from within the search task 302 (a recursive task call). The original call of "search(tree, v)" is converted into an interface register setting for Xs_tree, Xs_v, and Xs_rtn, a retrieval from the registers Xs_tree and Xs_v, and a jump in the control flow to the entry point L_Xsearch. A return of the control flow to continuation point L3 is established by setting the continuation register Xs_rtn to a value indicative of L3. Likewise, a box 708 shows another converted call to the search task 302 from within the search task 302 similar to that of box 704. Notably, conversion of the recursive calls within the search task 302 shown by boxes 706 and 708 is an intermediate step and such conversion will be further modified as outlined below.

A box 704 shows a converted call to the compute task 304 from the X process 306. The original call of "compute(xtree, xsum)" is converted into an interface register setting for Xc_tree and Xc_rtn, a jump in the control flow to the entry point L_Xcompute, and an interface register retrieval from Xc_sum. A return of the control flow to continuation point L2 is established by setting the continuation register Xc_rtn to a value indicative of L2.

A box 710 shows a converted call to the compute task 304 from within the compute task 304 (a recursive task call). The original call of "compute(LeftChild[tree], Isum)" is converted into an interface register setting for Xc_tree and Xc_rtn, a jump in the control flow to the entry point L_Xcompute, and a retrieval from the register Xc_sum. A return of the control flow to continuation point L4 is established by setting the continuation register Xs_rtn to a value indicative of L4. Likewise, a box 712 shows another converted call to the compute task 304 from within the compute task 304 similar to that of box 710. Notably, conversion of the recursive calls within the compute task 304 shown by boxes 710 and 712 is an intermediate step and such conversion will be further modified as outlined below.

The X process 306 is also optimized to account for the converted task calls, including a jump (goto) to the original portion 305 of the process at the beginning of the X process 306. Additional jumps are inserted at the ends of the privatized tasks 302 and 304. The changed portion of the X process 306 is generally shown in bold in FIG. 7.

Returning to the method 600 of FIG. 6, at block 604, each task call is analyzed to determine whether such task call is recursive or non-recursive. For each task call in the verification process that is non-recursive, the method 600 proceeds to block 614. No further conversion of non-recursive task calls from that of block 602 is performed. For each task call in the verification process that is recursive, the method proceeds to block 606. At block 606, each recursive task call is analyzed to determine wither such recursive task call is tail recursive or context recursive. For each recursive task call that is tail recursive, the method 600 proceeds to block 608. At block 608, the conversion of each tail recursive task call is modified to directly pass the same values of the interface registers to the recursively called task and then jump to the entry point of the recursively called task. Note that in some cases, the verification process may be optimized at block 608 as a result of the modifications.

For example, FIG. 8 illustrates the X process 306 after the recursive task calls have been modified. The recursive task calls in the search task 302 are tail recursive task calls in that the recursion occurs as a last step in the control flow of the task. A box 802 shows a modification of the converted task call 706. Rather than setting the interface registers for the search task 302, the interface registers are not set and hence are the values thereof are in effect directly passed to the recursive call of the search task 302. A jump to the task entry point L_Xsearch is performed. The converted task call 708 is similarly modified, as shown by the box 804. The verification process is optimized in that the continuation point L3 is no longer needed (since the setting of continuation register Xs_rtn will remain L1 throughout the recursion). The changed portion of the X process 306 is generally shown in bold in FIG. 8.

Returning to FIG. 6, for each recursive task call that is context recursive as determined at block 606, the method 600 proceeds to block 610. At block 610, a storage circuit is instantiated for saving a context of the recursive task from one recursive call to another. The context of the recursive task may include values of the interface registers, as well as values of local registers to the task. At block 612, the conversion of each context recursive task call is modified to insert context saving code before the interface register setting and to insert context restoring code after a continuation point.

Returning to FIG. 8, the recursive task calls in the compute task 304 are context recursive task calls in that the recursion occurs as an intermediate step in the control flow of the task. A stack storage circuit "Xc_Context" is instantiated to store contexts of the compute task 304 from one recursive iteration to the next (e.g., a first in last out memory). A box 806 shows a modification of the converted task call 710. Prior to the interface register setting, the context of the search task 304 is pushed into the stack storage circuit Xc_Context. The context of the search task 304 includes values of the interface registers Xc_tree and Xc_rtn, as well as values of local registers lsum and rsum. At the continuation point L4, the context of the search task 304 is popped (restored) from the stack storage circuit Xc_Context. The converted task 712 is similarly modified, as shown by the box 808.

Returning to FIG. 6, the analysis performed at blocks 604 and 606 may be performed using call graph analysis. The method 600 ends at block 614.

FIG. 9 illustrates the X process 306 after reorganization to describe an FSM. An FSM 902 includes states L_Xsearch, L_Xcompute, L4, L5, L_processX, L1, and L2, corresponding to the control flow transfer points described above. Note that the continuation point L3 has been optimized out of the search task, as described in the example above. The jumps in the control flow are implemented as transitions to another state. For example, the jump to L_Xsearch from the X process 306 (goto L_Xsearch) is replaced with "State=L_Xsearch".

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD).

While the foregoing is directed to embodiments of the present invention, other and further embodiments of the invention may be devised without departing from the basic scope thereof, and the scope thereof is determined by the claims that follow.

What is claimed is:

1. A method of translating a verification process for implementation in a hardware emulator of a logic verification system, comprising:

identifying a recursive task called by the verification process;

incorporating a copy of the recursive task into the verification process instantiating interface registers for the recursive task;

defining control flow transfer points in the verification process;

converting calls of the recursive task in the verification process to constructs for accessing of the interface registers and transferring control flow among the control flow transfer points; and reorganizing the verification process to describe a finite state machine (FSM) configured for implementation in the hardware emulator.

2. The method of claim 1, wherein the control flow transfer points include an entry point for the recursive task, an entry point for the verification process, and at least one continuation point, and wherein the constructs for transferring control flow include, for each of the calls, a jump in the control flow to the entry point and a return of the control flow to the at least one continuation point.

3. The method of claim 2, wherein the act of reorganizing comprises:

mapping the entry point for the recursive task, the entry point for the verification process, and the at least one continuation point to states of the FSM, the states including a single entry state and a single exit state.

4. The method of claim 2, wherein the interface registers include at least one argument register for storing at least one argument value of the recursive task, and a continuation register for storing a value indicative of any of the at least one continuation point.

5. The method of claim 4, wherein the constructs for accessing the interface registers include, for at least a portion of the calls, setting values to the interface registers and reading values from the interface registers.

6. The method of claim 1, wherein the act of converting comprises:

identifying context recursion in the recursive task; and instantiating a storage circuit for the recursive task, the storage circuit configured to store a context of the recursive task for each of the calls of the recursive task that originate within the recursive task.

7. The method of claim 1, further comprising:
determining that the recursive task is un-timed; and
instantiating a behavioral processor clock to time the FSM.

8. The method of claim 1, further comprising:
synthesizing the verification process to generate a gate-level; and
generating an implementation of the gate-level description for the hardware emulator.

9. Apparatus for translating a verification process for implementation in a hardware emulator of a logic verification system, comprising:
means for identifying a recursive task called by the verification process;
means for incorporating a copy of the recursive task into the verification process means for instantiating interface registers for the recursive task;
means for defining control flow transfer points in the verification process;
means for converting calls of the recursive task in the verification process to constructs for accessing of the interface registers and transferring control flow among the control flow transfer points; and
means for reorganizing the verification process to describe a finite state machine (FSM) configured for implementation in the hardware emulator.

10. The apparatus of claim 9, wherein the control flow transfer points include an entry point for the recursive task, an entry point for the verification process, and at least one continuation point, and wherein the constructs for transferring control flow include, for each of the calls, a jump in the control flow to the entry point and a return of the control flow to the at least one continuation point.

11. The apparatus of claim 10, wherein the means for reorganizing comprises:
means for mapping the entry point for the recursive task, the entry point for the verification process, and the at least one continuation point to states of the FSM, the states including a single entry state and a single exit state.

12. The apparatus of claim 10, wherein the interface registers include at least one argument register for storing at least one argument value of the recursive task, and a continuation register for storing a value indicative of any of the at least one continuation point.

13. The apparatus of claim 12, wherein the constructs for accessing the interface registers include, for at least a portion of the calls, setting values to the interface registers and reading values from the interface registers.

14. The apparatus of claim 9, wherein the means for converting comprises:
means for identifying context recursion in the recursive task; and
means for instantiating a storage circuit for the recursive task, the storage circuit configured to store a context of the recursive task for each of the calls of the recursive task that originate within the recursive task.

15. The apparatus of claim 9, further comprising:
means for determining that the recursive task is un-timed; and
means for instantiating a behavioral processor clock to time the FSM.

16. A non-transitory computer readable medium having stored thereon instructions that when executed by a processor cause the process to perform a method of translating a verification process for implementation in a hardware emulator of a logic verification system, comprising:
identifying a recursive task called by the verification process;
incorporating a copy of the recursive task into the verification process instantiating interface registers for the recursive task;
defining control flow transfer points in the verification process;
converting calls of the recursive task in the verification process to constructs for accessing of the interface registers and transferring control flow among the control flow transfer points; and
reorganizing the verification process to describe a finite state machine (FSM) configured for implementation in the hardware emulator.

17. The computer readable medium of claim 16, wherein the control flow transfer points include an entry point for the recursive task, an entry point for the verification process, and at least one continuation point, and wherein the constructs for transferring control flow include, for each of the calls, a jump in the control flow to the entry point and a return of the control flow to the at least one continuation point.

18. The computer readable medium of claim 17, wherein the act of reorganizing comprises:
mapping the entry point for the recursive task, the entry point for the verification process, and the at least one continuation point to states of the FSM, the states including a single entry state and a single exit state.

19. The computer readable medium of claim 17, wherein the interface registers include at least one argument register for storing at least one argument value of the recursive task, and a continuation register for storing a value indicative of any of the at least one continuation point.

20. The computer readable medium of claim 19, wherein the constructs for accessing the interface registers include, for at least a portion of the calls, setting values to the interface registers and reading values from the interface registers.

* * * * *